(12) United States Patent
Curran

(10) Patent No.: US 6,426,661 B1
(45) Date of Patent: Jul. 30, 2002

(54) CLOCK DISTRIBUTION WITH CONSTANT DELAY CLOCK BUFFER CIRCUIT

(75) Inventor: Brian W. Curran, Saugerties, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/933,193

(22) Filed: Aug. 20, 2001

(51) Int. Cl.[7] .................................................. G11C 5/14
(52) U.S. Cl. .................... 327/263; 327/262; 327/278
(58) Field of Search ................................ 327/261, 262, 327/362, 278, 285, 263, 206

(56) References Cited

U.S. PATENT DOCUMENTS

| | | | | |
|---|---|---|---|---|
| 5,459,437 A | * | 10/1995 | Campbell | 327/206 |
| 6,044,027 A | * | 3/2000 | Zheng et al. | 327/262 |
| 6,160,434 A | * | 12/2000 | Yoshimura et al. | 327/238 |

* cited by examiner

*Primary Examiner*—Dinh T. Le
(74) *Attorney, Agent, or Firm*—Lynn L. Augspurger

(57) ABSTRACT

A voltage-compensated, constant delay clock buffer for a chip clock distribution circuit employs a variable gain circuit to dynamically control the delay through the first inverter stage. In the presence of no voltage rail collapse the first stage gain is set high which results in a nominal delay through the first stage. As voltage rail collapse occurs local to the clock buffer circuit, the gain on the first stage is reduced to yield a smaller than nominal delay through the first stage in such a way as to compensate for the increased delay in the subsequent stage or stages. The control circuit is responsive to a first voltage rail and a second voltage rail to provide dynamic control of the delay through the first inverter stage. The circuit can compensate the circuit to handle a plurality of second inverter stages with the control circuit adjusting the delay of said first inverter stage, and with the control circuit remaining responsive to a first voltage rail and a second voltage rail.

8 Claims, 4 Drawing Sheets

Voltage-compensated, constant-delay buffer.

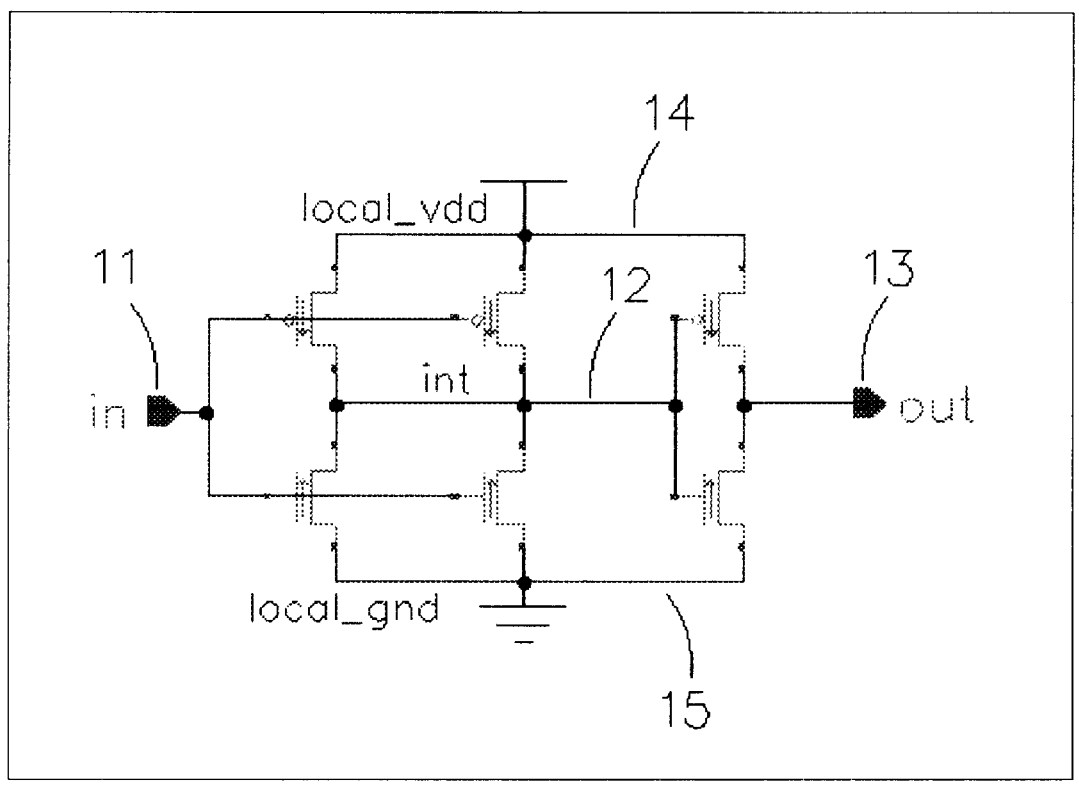
FIGURE 1. Prior-art

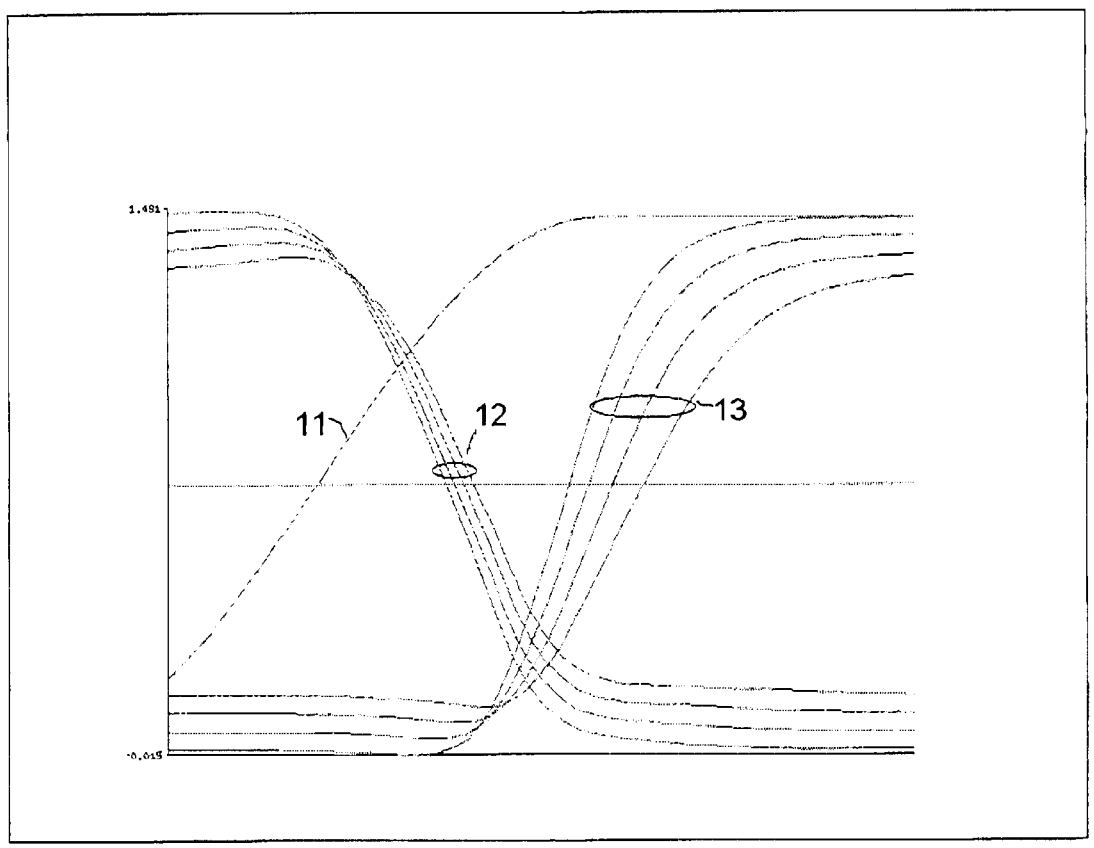
FIGURE 2. Prior-art buffer waveforms.

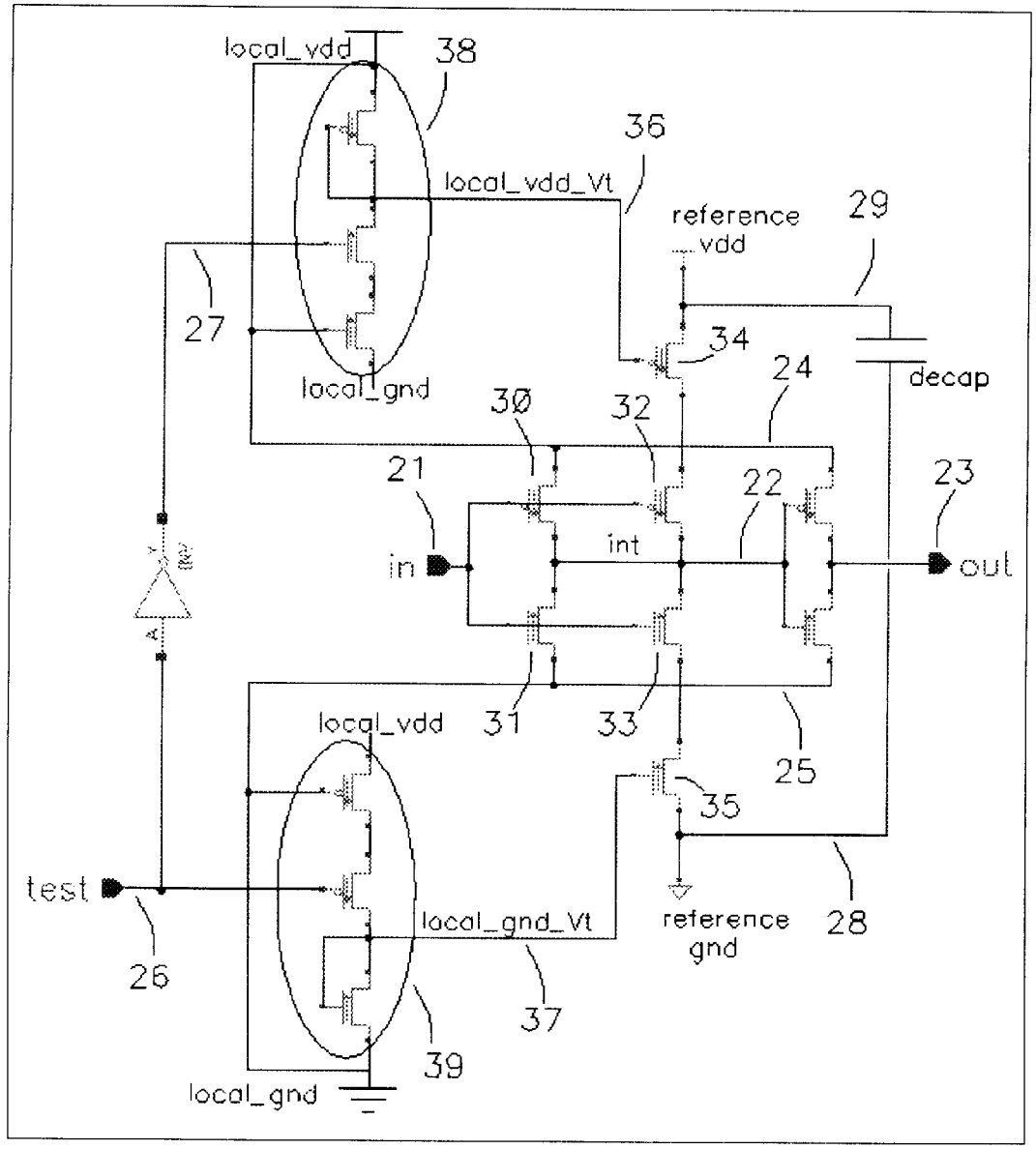
FIGURE 3. Voltage-compensated, constant-delay buffer.

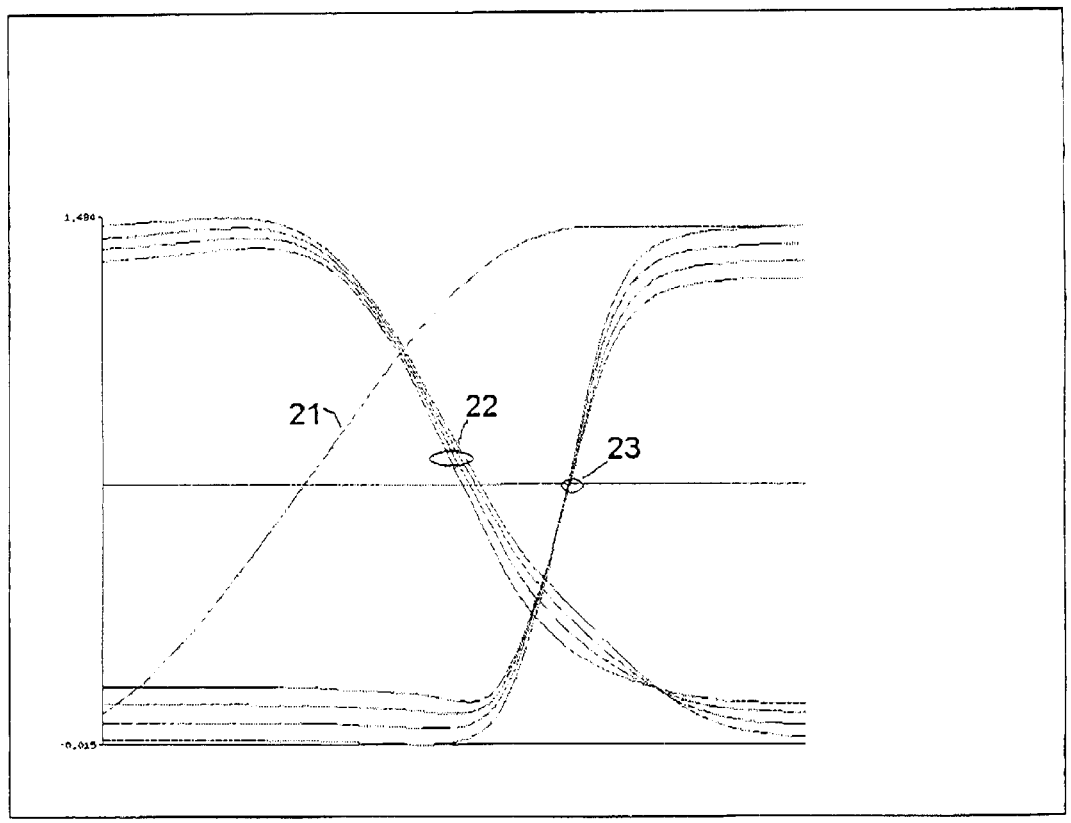
FIGURE 4. Voltage-compensated, constant-delay buffer waveforms.

CLOCK DISTRIBUTION WITH CONSTANT DELAY CLOCK BUFFER CIRCUIT

FIELD OF THE INVENTION

This invention relates to chip clock distribution circuits and particularly to a constant delay clock buffer therefor with voltage compensation.

Trademarks: S/390 and IBM are registered trademarks of International Business Machines Corporation, Armonk, N.Y., U.S.A. Other names may be registered trademarks or product names of International Business Machines Corporation or other companies.

BACKGROUND

The delay in distributing a clock to all parts of a chip is becoming a larger fraction of clock cycle time as chip frequency increases. Thus, in future CMOS chips even small delay variations in the branches of the clock distribution tree will result in large clock skew and/or large clock jitter. The delay of prior art clock distribution buffer circuits varied with voltage. When the local voltage powering the buffer is reduced (local rail collapse), the delay through the prior art buffer circuit increases. Multiple clock distribution buffer circuits are spatially distributed to generate and distribute a synchronous clock to all parts of a chip. In general the local Vdd and ground voltages powering each of these buffers is different and this results in a skewed clock arrival between different parts of the chip It is not always possible to eliminate the spatial variation in voltage which arises when the current demands of various parts of the chip quickly change (dI/dt). Thus, it would be beneficial to develop a clock buffer circuit with a constant delay independent of local Vdd and ground voltages. Known prior art clock distribution buffers have no voltage compensation, and the voltage compensated clock buffer invention illustrated herein results in a significant reduction in clock skew.

SUMMARY OF THE INVENTION

In accordance with the invention a voltage-compensating (constant delay) clock buffer circuit for a chip clock distribution circuit provides a constant delay independent of local Vdd and ground voltages by employing a voltage-compensating constant delay clock buffer circuit having an input, an output, a first voltage rail, a second voltage rail, a first inverter stage, a second inverter stage, and a control circuit to adjust the delay of said first inverter stage, said control circuit responsive to said first voltage rail and said second voltage rail to provide dynamic control of the delay through the first inverter stage.

The preferred embodiment of the invention is further implemented with detail which provides a primary reference Vdd and primary reference ground which are distributed to each clock buffer of the clock distribution network. These references do not suffer from dI/dt induced rail collapse and voltage rail overshoot since they are only supplied to clock buffer circuits and draw very little current (just enough to incrementally speed up first clock buffer stage in response to local rail collapse.) The gain of this first stage is controlled by a circuit which generates a control voltage approx. one device threshold voltage below the local Vdd and a control voltage approx. one device threshold voltage above the local ground. These control voltages effect the operation of supplemental device stacks in series with the first stage of the clock buffer. As local Vdd collapses below the reference Vdd, the supplemental PFET device stack assists the pull-up of the first stage; thereby reducing the delay through the first stage. Similarly as local ground rises above the reference ground, the supplemental NFET device stack assists the pulldown of the first stage; thereby reducing the delay through the first stage. The circuit which creates the control voltages dissipated a small amount of DC current. The invention includes a control pin which can be used to eliminate this DC current during tests which are rendered ineffective in the presence of such currents.

These and other improvements are set forth in the following detailed description. For a better understanding of the invention with advantages and features, refer to the description and to the drawings.

DESCRIPTION OF THE DRAWINGS

FIG. 1 illustrates a prior-art buffer without voltage compensation.

FIG. 2 is a plot which illustrates prior art buffer waveforms showing the prior-art buffer delay variation vs. voltage for rising input to rising output transition FIG. 3 illustrates a preferred embodiment of the new voltage compensated constant delay buffer circuit in accordance with the invention which uses a variable gain circuit to dynamically control the delay through the first inverter stage.

FIG. 4 illustrates the delay variation of the disclosed voltage-compensated clock buffer vs. voltage for rising input to rising output transition.

Our detailed description explains the preferred embodiments of our invention, together with advantages and features, by way of example with reference to the drawings.

DETAILED DESCRIPTION OF THE INVENTION

As mentioned above, known solutions in this area of clock distribution buffers had no voltage compensation. FIG. 1 is a schematic of a prior-art buffer. The buffer is powered by two voltage rails: a local Vdd rail 14 and a local ground rail 15. The in node 11 is buffered to drive an out node 13. This is accomplished via two standard CMOS inverters. The in node 11 is coupled to the input of an inverter which outputs int node 12. The int node 12 is coupled to the input of another inverter which outputs out node 13.

In accordance with the invention, my buffer circuit includes a variable gain circuit to dynamically control the delay through the first stage of the clock buffer. During time periods with no voltage rail collapse the gain of the first stage is high and the delay through the first stage is large. As voltage rail collapse occurs between local Vdd and local ground, this gain is made smaller to reduce the delay through the first stage. The delay through the first stage is reduced in such a way as to compensate for the increased delay in the following (uncompensated) stage or stages. This circuit provides a primary reference Vdd and primary reference ground which are distributed to each clock distribution buffer circuit. These references do not suffer from dI/dt induced rail collapse and overshoot since they are only supplied to clock buffer circuits and draw very little current (just enough to incrementally speed up first inverter stage in response to local rail collapse.). In the preferred implementation the gain is controlled by a circuit illustrated in FIG. 3 which generates a control voltage lower then the local Vdd ($local_{13}\ vdd_{13}\ Vt$) and a control voltage higher than local ground ($local_{13}\ gnd_{13}\ Vt$.) These control voltages directly drive PFET and NFET control devices. As local Vdd collapses below the reference Vdd, the PFET control device is turned ON (since PFET Vgs>Vt). This allows a supplemental PFET device of the first inverter stage to assist in pulling up the internal node which effectively reduces the gain and delay of the first inverter stage. Similarly as local ground rises above the reference ground, the NFET control device is turned ON. This allows the supplemental NFET device of the first inverter stage to assist in pulling down the internal node which effectively reduces the gain and delay of the first inverter stage.

FIG. 2 is a plot which illustrates the delay variation of the prior-art buffer vs. voltage for rising input to rising output transition. The in node 11 waveform is shown. The falling int node 12 waveforms demonstrate the behavior for four different voltages which correspond to four different quantities of rail collapse (0, 50, 100 and 150 milli-volts) between local ground and local Vdd. The rising out node 13 waveforms demonstrate the behavior for the same voltages (rail collapses.) The large voltage rail-collapse induced delay variation of the prior-art buffer is readily apparent.

Compensation for the voltage variation in clock distribution buffers is illustrated in FIG. 3 buffer circuit having an input, an output, a first voltage rail, a second voltage rail, a first inverter stage, a second inverter stage, and a control circuit to adjust the delay of the first inverter stage. This control circuit is responsive to the first voltage rail 24 and the second voltage rail 25 to provide in the preferred embodiment of the invention which provides a variable gain circuit to dynamically control the delay through the first inverter stage (in node 21 to int node 22 corresponding to the circuit outputting at 12 in FIG. 1) whereby the reduction in delay through the first inverter stage (in node 21 to int node 22) fully compensates for the increase in delay through the second inverter stage (int node 22 to out node 23). During time periods with no voltage rail collapse between the first voltage rail 24 and the second voltage rail 25, the gain of the first stage is high and the delay through the first inverter stage is large. As voltage rail collapse occurs the gain is made smaller to reduce the delay in the first inverter stage in such a way as to compensate for the increased delay in the uncompensated second stage. A local ground reference circuit 39 generates a local$_{13}$ gnd$_{13}$ Vt voltage 37 which is one NFET threshold voltage (Vt) above local ground, 25. This local gnd Vt voltage 37 is connected to the gate of control NFET 35. The source of control NFET 35 is tied to a reference ground 28. During periods of no local ground rail collapse the local ground rail 25 and reference ground 28 are at the same potential and control NFET 35 is right at the threshold of conduction. A rising transition on in node 21 will turn on NFETs 31 and 33 but since NFET 35 cannot conduct sufficient current, node int 22 will be discharged through NFET 31 only. During periods of local ground rail collapse the local ground 25 will rise to a potential higher than reference ground 28 and the control NFET 35 will start to conduct since its Vgs>Vt. Now a rising transition on in node 21 will turn on NFETs 31 and 33. A conduction path will exist through the series-connected NFETs 33 and 35 which will discharge node int 22 more rapidly.

A local Vdd reference circuit 38 generates a local_vdd_ Vt voltage 36 which is one PFET threshold voltage (Vt) below local Vdd, 24. This local$_{13}$ vdd$_{13}$ Vt voltage 36 is connected to the gate of control PFET 34. The source of control PFET 34 is tied to a reference Vdd 29. During periods of no local Vdd rail collapse the local Vdd 24 and reference Vdd 29 are at the same potential and control PFET 34 is right at the threshold of conduction. A falling transition on in node 21 will turn on PFETs 30 and 32 but since PFET 34 cannot conduct sufficient current, node int 22 will be charged through PFET 30 only. During periods of local Vdd rail collapse the local Vdd voltage rail 24 will fall to a potential lower than reference Vdd 29 and the control PFET 34 will start to conduct since its Vgs>Vt. Now a falling transition on in node 21 will turn on PFETs 30 and 32. A conduction path will exist through the series-connected PFETs 32 and 34 which will charge node int 22 more rapidly.

A small amount of DC current flows through the local ground reference circuit 39 and the local Vdd reference circuit 38. A test control input (test) 26 can be incorporated in the disclosed voltage-compensated clock buffer circuit to eliminate this DC current flow. This test control input 26 would be activated during chip tests which would otherwise be rendered ineffective in the presence of DC current.

FIG. 4 is a plot which illustrates the delay variation of the voltage-compensated clock buffer vs. voltage for rising input to rising output transition. The in node 21 waveform is shown. The falling int node 22 waveforms demonstrate the behavior for four different voltages which correspond to four different quantities of rail collapse (0, 50, 100 and 150 milli-volts) between local ground and local Vdd. The rising out node 23 waveforms demonstrate the behavior for the same voltages (rail collapses.) From the plots it is readily apparent that the reduction in delay through the first inverter stage (in node 21 to int node 22) fully compensates for the increase in delay through the second inverter stage (int node 22 to out node 23.)

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A constant delay clock buffer circuit, comprising:
 a buffer circuit having an input node (21) of said buffer circuit coupled to an output node (23) of said buffer circuit and wherein said buffer circuit is powered by a first voltage rail and a second voltage rail, said input node being buffered to drive said output node with a first inverter stage coupled to a second inverter stage which drives said output node, and a variable gain control circuit to adjust the delay of said first inverter stage by pulling up said first inverter stage with parallel supplemental pull up device networks of said first inverter stage to reduce the delay of said first inverter stage responsive to a voltage collapse between said first voltage rail and said second voltage rail and for adjusting the delay of said first inverter stage by pulling down said first inverter stage with parallel supplemental pull down device networks for said first inverter stage to increase the delay of said first inverter stage responsive to a voltage overshoot between said first voltage rail and second voltage rail.

2. The circuit according to claim 1, whereby said variable gain control circuit adjusts the delay of said first inverter stage to compensate for the voltage rail induced increased delay of said second inverter stage.

3. The circuit according to claim 1, whereby one of said plurality of parallel pulldown networks is responsive to said variable gain control circuit and whereby one of said plurality of parallel pull-up networks is responsive to said control circuit.

4. The circuit according to claim 3, whereby said variable gain control circuit generates a first control signal one threshold voltage above said first voltage rail and a second control signal one threshold voltage below said second voltage rail.

5. The circuit according to claim 4, whereby said first control signal is coupled to one of said plurality of parallel pulldown networks and second control signal is to one of said plurality of parallel pull-up networks.

6. The circuit according to claim 5, including a test input, said test input coupled to said control circuit to selectively disable said control circuit such that no current flows through said control circuit.

7. The circuit according to claim 1, whereby said input is coupled to said first inverter stage, said first inverter stage is coupled to said second inverter stage and said second inverter stage is coupled to said output.

8. The circuit according to claim 1, whereby said input is coupled to said second inverter stage, said second inverter stage is coupled to said first inverter stage and said first inverter stage is coupled to said output.

* * * * *